(12) United States Patent
Han

(10) Patent No.: US 11,295,830 B2
(45) Date of Patent: Apr. 5, 2022

(54) MEMORY SYSTEM AND OPERATING METHOD OF THE MEMORY SYSTEM

(71) Applicant: SK hynix Inc., Icheon-si (KR)

(72) Inventor: Ju Hyeon Han, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 85 days.

(21) Appl. No.: 16/865,039

(22) Filed: May 1, 2020

(65) Prior Publication Data
US 2021/0098071 A1   Apr. 1, 2021

(30) Foreign Application Priority Data

Oct. 1, 2019   (KR) ........................ 10-2019-0121687

(51) Int. Cl.
| | |
|---|---|
| G11C 29/44 | (2006.01) |
| G06F 3/06 | (2006.01) |
| G06F 11/10 | (2006.01) |
| G11C 16/04 | (2006.01) |
| G11C 16/10 | (2006.01) |
| G11C 11/56 | (2006.01) |

(52) U.S. Cl.
CPC ............ *G11C 29/44* (2013.01); *G06F 3/0604* (2013.01); *G06F 3/064* (2013.01); *G06F 3/0659* (2013.01); *G06F 3/0673* (2013.01); *G06F 11/1076* (2013.01); *G11C 11/5628* (2013.01); *G11C 16/0483* (2013.01); *G11C 16/10* (2013.01)

(58) Field of Classification Search
CPC . G11C 29/44; G11C 11/5628; G11C 16/0483; G11C 16/10; G06F 3/0604; G06F 3/064; G06F 3/0659; G06F 3/0673; G06F 11/1076
See application file for complete search history.

(56) References Cited

U.S. PATENT DOCUMENTS

| | | | | |
|---|---|---|---|---|
| 9,570,177 | B2* | 2/2017 | Choi | ........................ G06F 3/06 |
| 2011/0283135 | A1* | 11/2011 | Burger | ................ G06F 11/0766 |
| | | | | 714/6.1 |
| 2015/0332773 | A1* | 11/2015 | Kwak | ................ G11C 16/3445 |
| | | | | 365/185.11 |
| 2016/0141026 | A1* | 5/2016 | Lee | ..................... G11C 11/5628 |
| | | | | 365/185.03 |
| 2016/0179596 | A1* | 6/2016 | Kim | ................... G11C 29/4401 |
| | | | | 714/704 |
| 2017/0177425 | A1* | 6/2017 | Jei | ........................ G06F 11/1072 |
| 2019/0303245 | A1* | 10/2019 | Romanenko | ........ G06F 11/1451 |

FOREIGN PATENT DOCUMENTS

KR   101660985 B1   10/2016

* cited by examiner

*Primary Examiner* — Kyle Vallecillo
(74) *Attorney, Agent, or Firm* — William Park & Associates Ltd.

(57) ABSTRACT

There are provided a memory system and an operating method of the memory system. The memory system includes: a memory device including a plurality of memory blocks; and a memory controller for controlling the memory device to detect an initial bad block by performing an initial test operation on the plurality of memory blocks. The memory controller registers and manages, as a weak memory block, memory blocks physically adjacent to the detected initial bad block.

18 Claims, 11 Drawing Sheets

MEMORY SYSTEM AND OPERATING METHOD OF THE MEMORY SYSTEM

CROSS-REFERENCE TO RELATED APPLICATION

The present application claims priority under 35 U.S.C. § 119(a) to Korean patent application number 10-2019-0121687 filed on Oct. 1, 2019, the entire disclosure of which is incorporated herein by reference.

BACKGROUND

1. Technical Field

The present disclosure generally relates to a memory system and an operating method thereof, and more particularly, to a memory system capable of efficiently managing a weak memory block and an operating method of the memory system.

2. Related Art

The paradigm on recent computer environment has been turned into ubiquitous computing environment in which computing systems can be used anywhere and anytime. This promotes increasing usage of portable electronic devices such as mobile phones, digital cameras, notebook computers, and the like. Such portable electronic devices may generally include a memory system using a memory device, i.e., a data storage device. The data storage device is used as a main memory device or an auxiliary memory device of the portable electronic devices.

A data storage device using a memory device has excellent stability and durability, high information access speed, and low power consumption, since there is no mechanical driving part. In an example of memory systems having such advantages, the data storage device includes a Universal Serial Bus (USB) memory device, memory cards having various interfaces, a Solid State Drive (SSD), and the like.

SUMMARY

In accordance with an aspect of the present disclosure, there is provided a memory system including: a memory device including a plurality of memory blocks; and a memory controller configured to control the memory device to detect an initial bad block by performing an initial test operation on the plurality of memory blocks, wherein the memory controller registers and manages, as a weak memory block, memory blocks physically adjacent to the detected initial bad block.

In accordance with another aspect of the present disclosure, there is provided a memory system including: a memory device including a plurality of semiconductor memories; and a memory controller configured to control the memory device to detect an initial bad block among a plurality of memory blocks included in each of the plurality of semiconductor memories by performing an initial test operation on the plurality of semiconductor memories, wherein the memory controller registers, as a weak memory block, memory blocks adjacent to the detected initial bad block, and selects the weak memory block as a chipkill memory block which stores a chipkill parity of the plurality of semiconductor memories.

In accordance with still another aspect of the present disclosure, there is provided a method for operating a memory system, the method including: detecting an initial bad block among a plurality of memory blocks included in a memory device by performing an initial test operation; registering, as a weak memory block, memory blocks physically adjacent to the detected initial bad block among the plurality of memory blocks; receiving a program request for cold data from the outside; and programming the cold data by selecting at least one of the memory blocks registered as the weak memory block.

In accordance with still another aspect of the present disclosure, there is provided a method for operating a memory system, the method including: detecting an initial bad block among a plurality of memory blocks included in a memory device by performing an initial test operation; registering, as a weak memory block, memory blocks physically adjacent to the detected initial bad block among the plurality of memory blocks; storing program data in a selected memory block among the plurality of memory blocks in a program operation; storing chipkill parity data by using data stored in the selected memory block and data stored in some memory blocks of which program operation has been completed among the plurality of memory blocks; and selecting, as a chipkill memory block, any one of the memory blocks registered as the weak memory block, and storing the chipkill parity data in the chipkill memory block.

BRIEF DESCRIPTION OF THE DRAWINGS

Examples of embodiments will now be described hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Hereinafter, embodiments of the present disclosure will be described in detail with reference to the accompanying drawings in order for those skilled in the art to be able to readily implement the technical spirit of the present disclosure.

Embodiments provide a memory system capable of improving stability and reliability by efficiently managing a weak memory block, and an operating method of the memory system.

Figure 1:
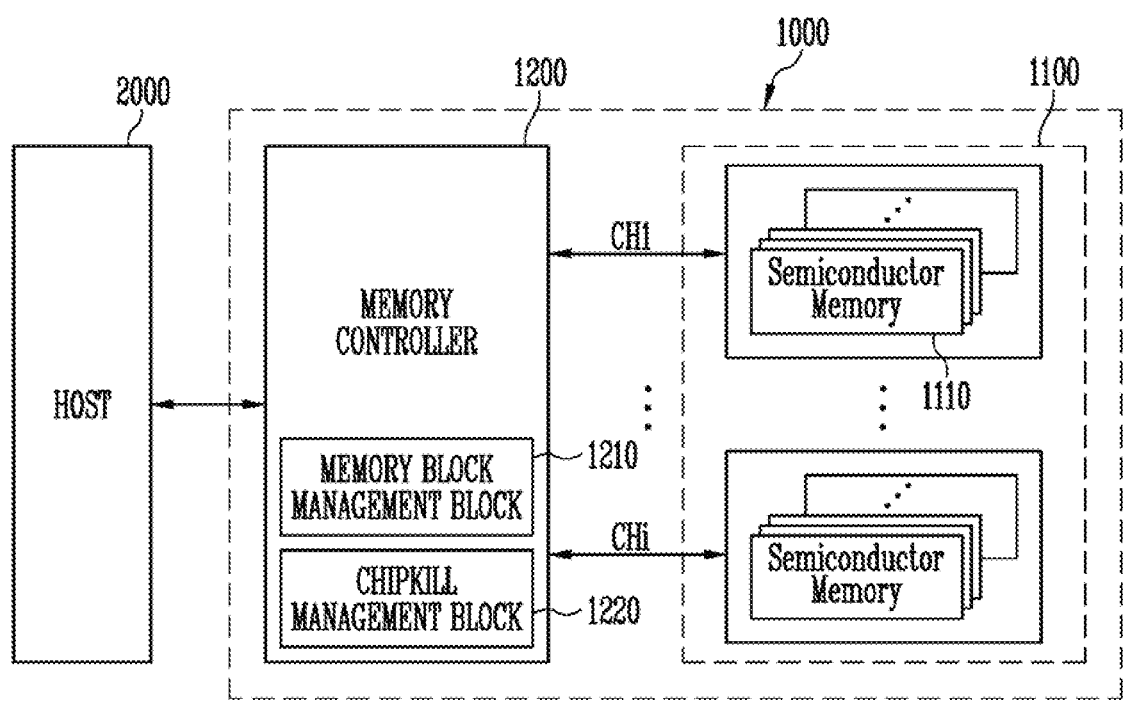
FIG. 1 is a diagram illustrating a memory system in accordance with an embodiment of the present disclosure.

FIG. 1 is a diagram illustrating a memory system in accordance with an embodiment of the present disclosure.

Referring to FIG. 1, the memory system 1000 includes a memory device 1100 and a memory controller 1200. The memory system 1000 may further include a buffer memory (not shown). The memory device 1100 may include a plurality of semiconductor memories 1110. The plurality of semiconductor memories 1110 may be divided into a plurality of memory groups. Each of the plurality of semiconductor memories 1110 may be configured as, for example, a memory chip.

In FIG. 1, a case where the plurality of memory groups communicate with the memory controller 1200 respectively through first to ith channels CH1 to CHi is illustrated. Each semiconductor memory 1110 will be described later with reference to FIG. 3.

Each memory group communicates with the memory controller 1200 through one common channel. The memory controller 1200 controls the plurality of semiconductor memories 1110 of the memory device 1100 through the plurality of channels CH1 to CHi.

The memory controller 1200 is coupled between a host 2000 and the memory device 1100. The memory controller 1200 accesses the memory device 1100 in response to a request from the host 2000. For example, the memory controller 1200 controls read, write, erase, and background operations of the memory device 1100 in response to a request received from the host 2000. The memory controller 1200 provides an interface between the memory device 1100 and the host 2000. The memory controller 1200 drives firmware for controlling the memory device 1100.

The memory system 1000 detects initial bad blocks which do not normally operate among a plurality of memory blocks included in each of the plurality of semiconductor memories 1110 by performing an initial test operation in a test phase before the memory system 1000 performs general operations after the memory system 1000 is produced as a product. An initial bad block refers to a bad block generated when the semiconductor memories 1110 are produced for the first time. On the other hand, a bad block generated while the semiconductor memories 1110 are being used may be defined as a runtime bad block.

Information on the detected initial bad blocks is stored in the memory controller 1200, and the memory system 1000 performs overall operations, e.g., a read operation, a write operation, an erase operation, and the like by selecting the other normal memory blocks except the initial bad blocks among the plurality of memory blocks in the overall operations of the memory system 1000.

The memory controller 1200 may include a memory block management block 1210 and a chipkill management block 1220.

The memory block management block 1210 registers and manages memory blocks physically adjacent to an initial bad block as a weak memory block, based on information on the initial bad block. In an embodiment of the present disclosure, the memory blocks registered as the weak memory block may be selected and used in a cold data program operation, a program operation may be performed using a Single Level Cell (SLC) program scheme having high reliability, and a refresh period may be set shorter than a period of the other normal memory blocks. Cold data may mean data having a relatively low read or write frequency, and hot data may mean data having a high data read or write frequency. A reference (e.g., a read or write frequency) for classifying the hot data and the cold data from each other may be set and changed by the memory controller 1200.

The chipkill management block 1220 may use the memory blocks registered as the weak memory block as chipkill memory blocks which store a chipkill parity in a chipkill operation. The chipkill operation will be described later.

The host 2000 controls the memory system 1000. The host 2000 includes portable electronic devices such as a computer, a PDA, a PMP, an MP3 player, a camera, a camcorder, and a mobile phone. The host 2000 may request a write operation, a read operation, an erase operation, or the like of the memory system 1000 through a command.

The memory controller 1200 and the memory device 1100 may be integrated into one semiconductor device. In an embodiment, the memory controller 1200 and the memory device 1100 may be integrated into one semiconductor device, to constitute a memory card. For example, the memory controller 1200 and the memory device 1100 may be integrated into one semiconductor device, to constitute a memory card such as a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD card (SD, miniSD, microSD or SDHC), or a Universal Flash Storage (UFS).

The memory controller 1200 and the memory device 1100 may be integrated into one semiconductor device to constitute a semiconductor drive (Solid State Drive (SSD)). The semiconductor drive SSD includes a storage device configured to store data in a semiconductor memory. When the memory system 1000 is used as the semiconductor drive SSD, the operation speed of the host 2000 coupled to the memory system 1000 is remarkably improved.

In another example, the memory system 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multi-Media Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, the memory device 1100 or the memory system 1000 may be packaged in various forms. For example, the memory device 1100 or the memory system 1000 may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), Plastic Metric Quad Flat Pack (PMQFP), Thin Quad Flat Pack (TQFP), Small Outline Integrated Circuit (SOIC), Shrink Small Outline Package (SSOP), Thin Small Outline Package (TSOP), Thin Quad Flat Pack (TQFP), System In Package (SIP), Multi-Chip Package (MCP), Wafer-level Fabricated Package (WFP), or Wafer-level processed Stack Package (WSP).

Figure 2:
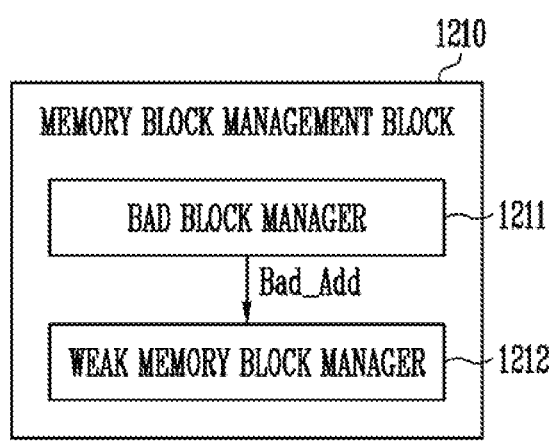
FIG. 2 is a diagram illustrating a memory block management block shown in FIG. 1.

FIG. 2 is a diagram illustrating the memory block management block shown in FIG. 1.

Referring to FIG. 2, the memory block management block 1210 may include a bad block manager 1211 and a weak memory block manager 1212.

The bad block manager 1211 stores information (e.g., addresses) on memory blocks detected as initial bad blocks, based on a result obtained by performing an initial test operation. Also, the bad block manager 1211 may store information on runtime bad blocks generated while the memory system is being used. The bad block manager 1211 prevents the initial bad blocks and the runtime bad blocks from being selected in overall operations of the memory system, based on the information on the initial bad blocks and the information on the runtime bad blocks. Also, the bad block manager 1211 may output information Bad_Add on initial bad blocks to the weak memory block manager 1212.

The weak memory block manager 1212 registers and manages, as a weak memory block, memory blocks physically adjacent to a memory block determined as a bad block among a plurality of memory blocks included in the memory device 1100, based on the information Bad_Add on the initial bad blocks. In accordance with an embodiment of the present disclosure, the memory blocks registered as the weak memory block may be used in a cold data program operation, a program operation may be performed using a Single Level Cell (SLC) program scheme having high reliability of the program operation, or a refresh period may be set shorter than that of the other normal memory blocks. In accordance with another embodiment of the present disclosure, the weak memory block may be used as a chipkill memory block to store a chipkill parity.

Figure 3:
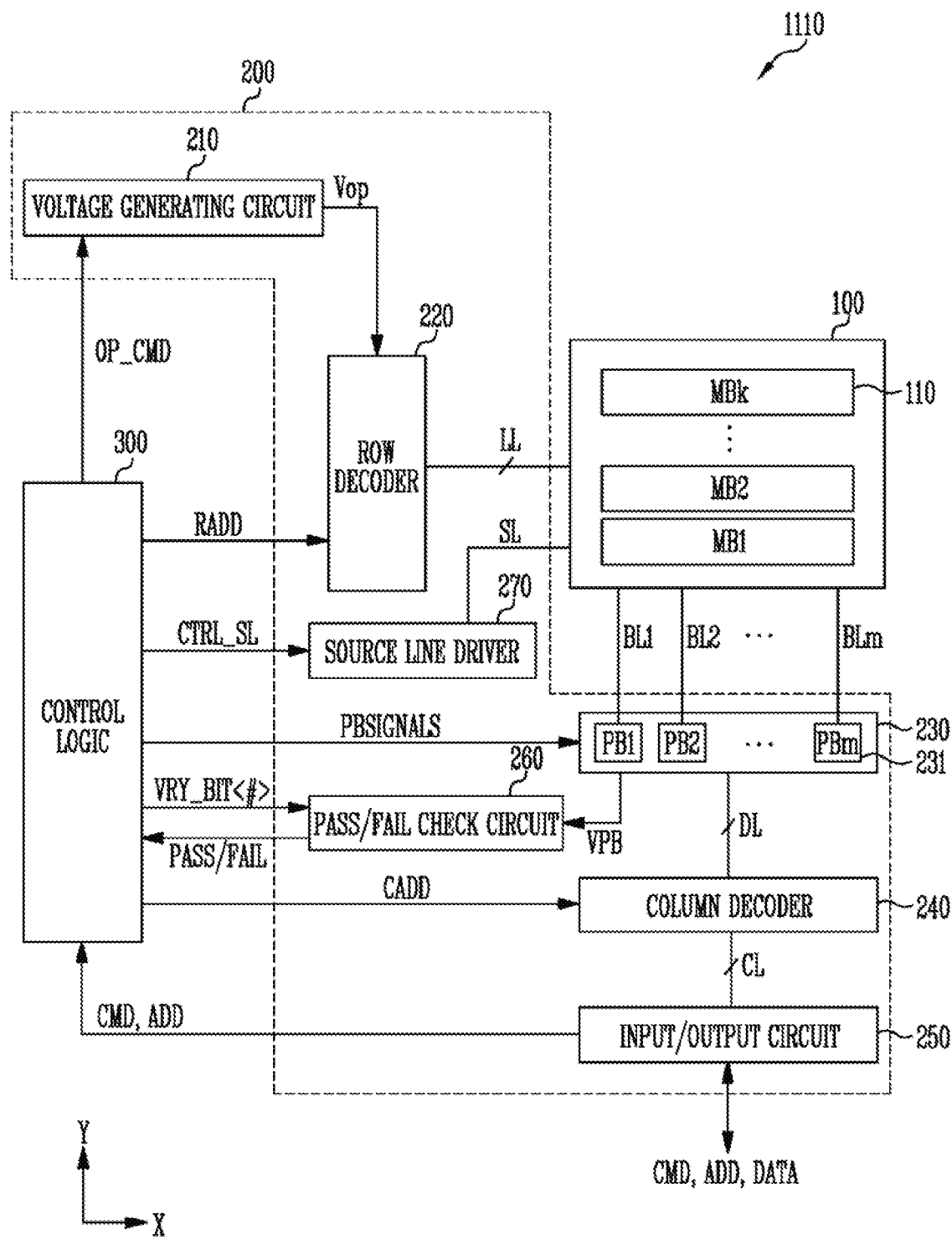
FIG. 3 is a diagram illustrating a semiconductor memory shown in FIG. 1.

FIG. 3 is a diagram illustrating the semiconductor memory shown in FIG. 1.

Referring to FIG. 3, the semiconductor memory 1110 may include a memory cell array 100 in which data is stored. The semiconductor memory 1110 may include peripheral circuits 200 configured to perform a program operation for storing data in the memory cell array 100, a read operation for outputting the stored data, and an erase operation for erasing the stored data. The semiconductor memory 1110 may include control logic 300 configured to control the peripheral circuits 200 under the control of the controller (1200 shown in FIG. 1). The control logic 300 may be implemented as hardware, software, or a combination of hardware and software. For example, the control logic 300 may be a control logic circuit operating in accordance with an algorithm and/or a processor executing control logic code.

The memory cell array 100 may include memory blocks MB1 to MBk 110 (k is a positive integer). Local lines LL and bit lines BL1 to BLm (m is a positive integer) may be coupled to the memory blocks MB1 to MBk 110. For example, the local lines LL may include a first select line, a second select line, and a plurality of word lines arranged between the first and second select lines. Also, the local lines LL may further include dummy lines arranged between the first select line and the word lines and between the second select line and the word lines. The first select line may be a source select line, and the second select line may be a drain select line. For example, the local lines LL may include word lines, dummy word lines, drain and source select lines, and source lines. For example, the local lines LL may further include dummy lines. For example, the local lines LL may further include pipe lines. The local lines LL may be coupled to the memory blocks MB1 to MBk 110, respectively, and the bit lines BL1 to BLm may be commonly coupled to the memory blocks MB1 to MBk 110. The memory blocks MB1 to MBk 110 may be implemented in a two-dimensional or three-dimensional structure. For example, memory cells may be arranged in a direction parallel to a substrate in memory blocks 110 having a two-dimensional structure. For example, memory cells may be arranged in a direction vertical to a substrate in memory blocks 110 having a three-dimensional structure.

The peripheral circuits 200 may be configured to perform program, read, and erase operations of a selected memory block 110 under the control of the control logic 300.

For example, the peripheral circuits 200 may include a voltage generating circuit 210, a row decoder 220, a page buffer group 230, a column decoder 240, an input/output circuit 250, a pass/fail check circuit 260, and a source line driver 270.

The voltage generating circuit 210 may generate various operating voltages Vop used for program, read, and erase operations in response to an operation signal OP_CMD. For example, the voltage generating circuit 210 may generate a program voltage, a verify voltage, pass voltages, a read voltage, a source line voltage, and the like under the control of the control logic 300.

The row decoder 220 may transfer the operating voltages Vop to local lines LL coupled to the selected memory block 110 in response to a row address RADD.

The page buffer group 230 may include a plurality of page buffers PB1 to PBm 231 coupled to the bit lines BL1 to BLm. The page buffers PB1 to PBm 231 may operate in response to page buffer control signals PBSIGNALS. For example, the page buffers PB1 to PBm 231 may temporarily store data received through data lines DL and then control voltage levels of the bit lines BL1 to BLm according to the temporarily stored data in a program operation, or sense voltages or currents of the bit lines BL1 to BLm in a read or verify operation.

The column decoder 240 may transfer data between the input/output circuit 250 and the page buffer group 230 in response to a column address CADD. For example, the column decoder 240 may exchange data with the page buffers 231 through the data lines DL, or exchange data with the input/output circuit 250 through column lines CL.

The input/output circuit 250 may transfer a command CMD and an address ADD, which are received from the controller (1200 shown in FIG. 1), to the control logic 300, or exchange data DATA with the column decoder 240.

In a read operation or verify operation, the pass/fail check circuit 260 may generate a reference current in response to an allow bit VRY_BIT<#>, and output a pass signal PASS or a fail signal FAIL by comparing a sensing voltage VPB received from the page buffer group 230 with a reference voltage generated by the reference current.

The source line driver 270 may be coupled to a memory cell included in the memory cell array 100 through a source line SL, and control a voltage of a source node. In an example, the source line driver 270 may electrically couple the source node of the memory cell to a ground node in a read or verify operation. Also, the source line driver 270 may apply a ground voltage to the source node of the memory cell in a program operation. The source line driver 270 may apply an erase voltage to the source node of the memory cell in an erase operation. The source line driver 270 may receive a source line control signal CTRL_SL from the control logic 300, and control the voltage of the source node, based on the source line control signal CTRL_SL.

The control logic 300 may control the peripheral circuits 200 by outputting the operation signal OP_CMD, the control signals AD_signals, the page buffer control signals PBSIG-NALS, and the allow bit VRY_BIT<#> in response to the command CMD and the address ADD. Also, the control logic 300 may determine whether the verify operation has passed or failed in response to the pass or fail signal PASS or FAIL.

The control logic 300 may control the peripheral circuits 200 to perform a test program operation, a test read operation, or a test erase operation on each of the plurality of memory blocks MB1 to MBk 110 in an initial test operation. When it is determined that the test program operation has failed based on a result obtained by performing the test program operation, when it is determined that the test read operation has failed based on a result obtained by performing the test read operation, or when it is determined that the test erase operation has failed based on a result obtained by performing the test erase operation, the control logic 300 may determine the corresponding memory block as an initial bad block, and transmit information on the initial bad block to the memory controller (1200 shown in FIG. 1).

Figure 4:
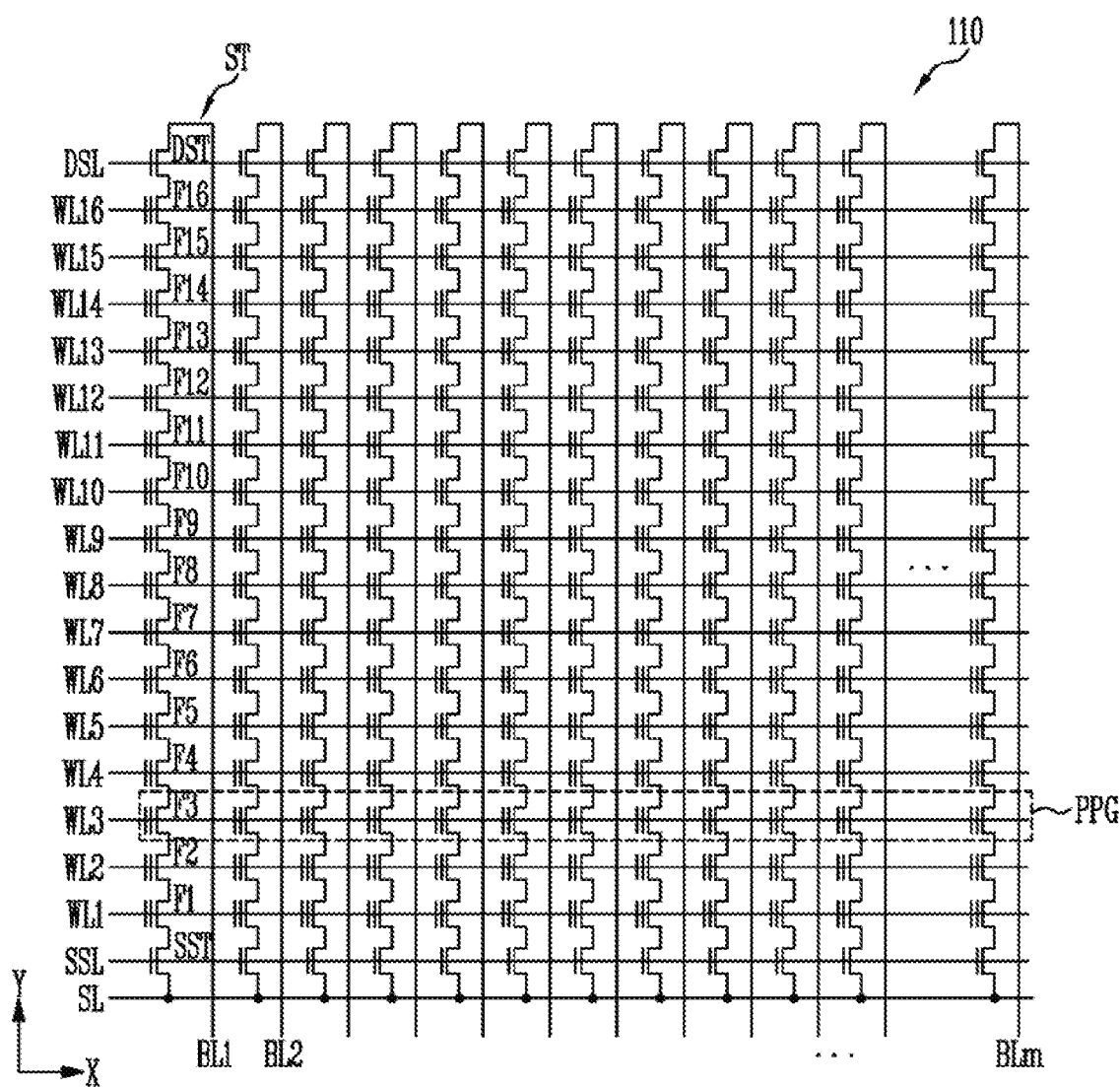
FIG. 4 is a diagram illustrating a memory block shown in FIG. 3.

FIG. 4 is a diagram illustrating the memory block shown in FIG. 3.

Referring to FIG. 4, in the memory block 110, a plurality of word lines arranged in parallel to one another may be coupled between a first select line and a second select line. The first select line may be a source select line SSL, and the second select line may be a drain select line DSL. For example, the memory block 110 may include a plurality of strings ST coupled between bit lines BL1 to BLm and a source line SL. The bit lines BL1 to BLm may be coupled to the strings ST, respectively, and the source line SL may be commonly coupled to the strings ST. The strings ST may be configured identically to one another, and therefore, a string ST coupled to a first bit line BL1 will be described as an example.

The string ST may include a source select transistor SST, a plurality of memory cells F1 to F16, and a drain select transistor DST, which are coupled in series between the source line SL and the first bit line BL1. At least one source select transistor SST and at least one drain select transistor DST may be included in one string ST, and memory cells of which number is greater than that of the memory cells F1 to F16 shown in the drawing may be included in the one string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of source select transistors SST included in different strings ST may be coupled to the source select line SSL, gates of drain select transistors DST included in different strings ST may be coupled to the drain select line DSL, and gates of the memory cells F1 to F16 included in different strings ST may be coupled to a plurality of word lines WL1 to WL16. A group of memory cells coupled to the same word line among the memory cells included in different strings ST may be referred as a physical page PPG. Therefore, physical pages PPG of which number corresponds to that of the word lines WL1 to WL16 may be included in the memory block 110.

One memory cell may store data of one bit. This is generally referred to as a Single Level Cell (SLC). Therefore, one physical page PPG may store one logical page (LPG) data. One LPG data may include data bits of which number corresponds to that of cells included in one physical page PPG. In addition, one memory cell may store data of two or more bits. This is generally referred to as a Multi-Level Cell (MLC).

Figure 5:
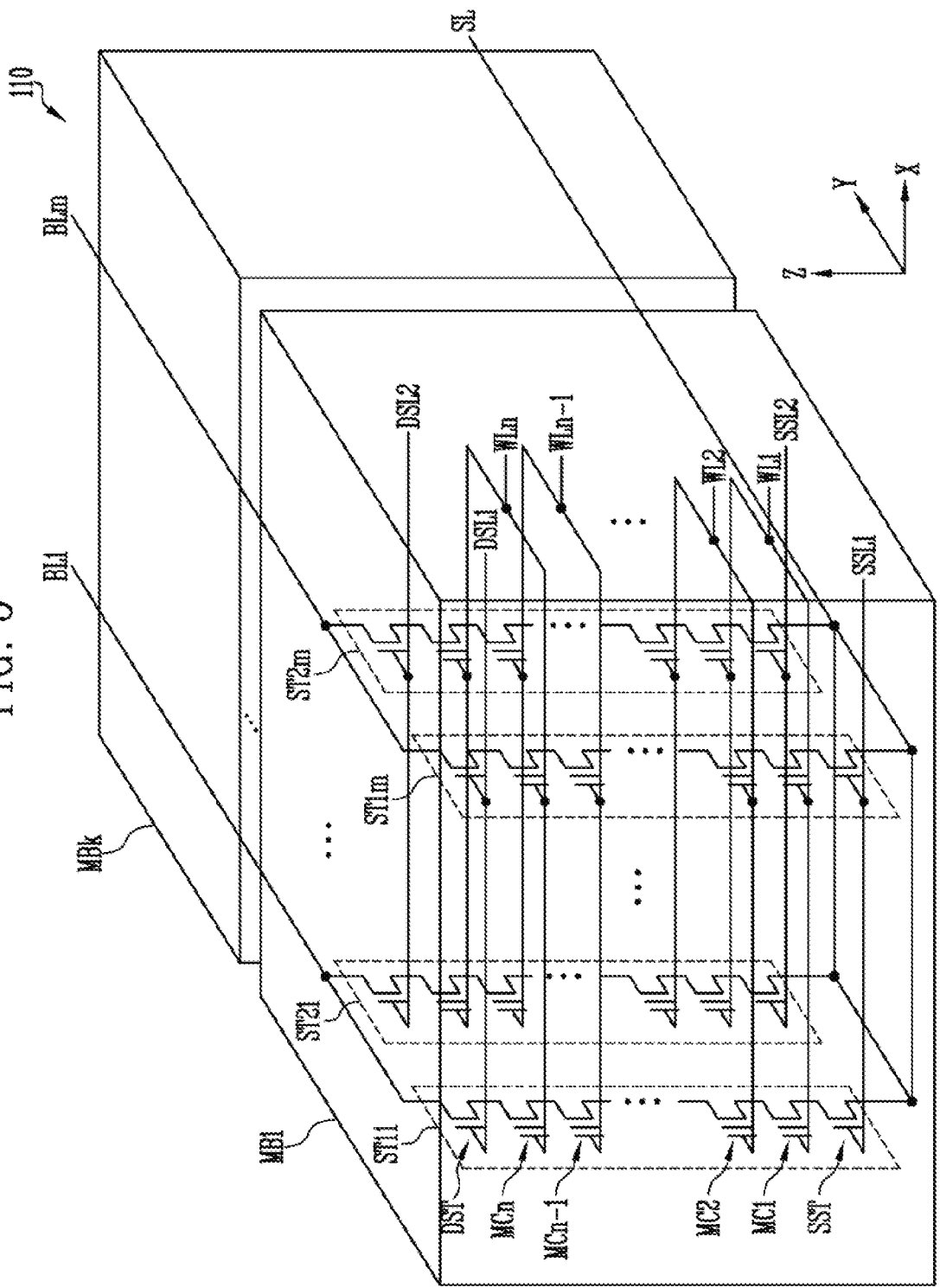
FIG. 5 is a diagram illustrating an embodiment of a three-dimensionally configured memory block.

FIG. 5 is a diagram illustrating an embodiment of a three-dimensionally configured memory block.

Referring to FIG. 5, the memory cell array 100 may include a plurality of memory blocks MB1 to MBk 110. A memory block 110 may include a plurality of strings ST11 to ST1m and ST21 to ST2m. Each of the plurality of strings ST11 to ST1m and ST21 to ST2m may extend along a vertical direction (Z direction). In the memory block 110, m strings may be arranged in a row direction (X direction). Although a case where two strings are arranged in a column direction (Y direction) is illustrated in FIG. 5, this is for convenience of description, and three or more strings may be arranged in the column direction (Y direction).

Each of the plurality of strings ST11 to ST1m and ST21 to ST2m may include at least one source select transistor SST, first to nth memory cells MC1 to MCn, and at least one drain select transistor DST.

The source select transistor SST of each string may be coupled between a source line SL and the memory cells MC1 to MCn. The source select transistors of strings arranged on the same row may be coupled to the same source select line. The source select transistors of strings ST11 to ST1m arranged on a first row may be coupled to a first source select line SSL1. The source select transistors of strings ST21 to ST2m arranged on a second row may be coupled to a second source select line SSL2. In another embodiment, the source select transistors of the strings ST11 to ST1m and ST21 to ST2m may be commonly coupled to one source select line.

The first to nth memory cells MC1 to MCn of each string may be coupled in series between the source select transistor SST and the drain select transistor DST. Gates of the first to nth memory cells MC1 to MCn may be respectively coupled to first to nth word lines WL1 to WLn.

In an embodiment, at least one of the first to nth memory cells MC1 to MCn may be used as a dummy memory cell. When the dummy memory cell is provided, the voltage or current of a corresponding string can be stably controlled. Accordingly, the reliability of data stored in the memory block 110 can be improved.

The drain select transistor DST of each string may be coupled between a bit line and the memory cells MC1 to MCn. The drain select transistors DST of strings arranged in the row direction may be coupled to a drain select line extending in the row direction. The drain select transistors DST of the strings ST11 to ST1m on the first row may be coupled to a first drain select line DSL1. The drain select transistors DST of the strings ST21 to ST2m on the second row may be coupled to a second drain select line DSL2.

Figure 6:
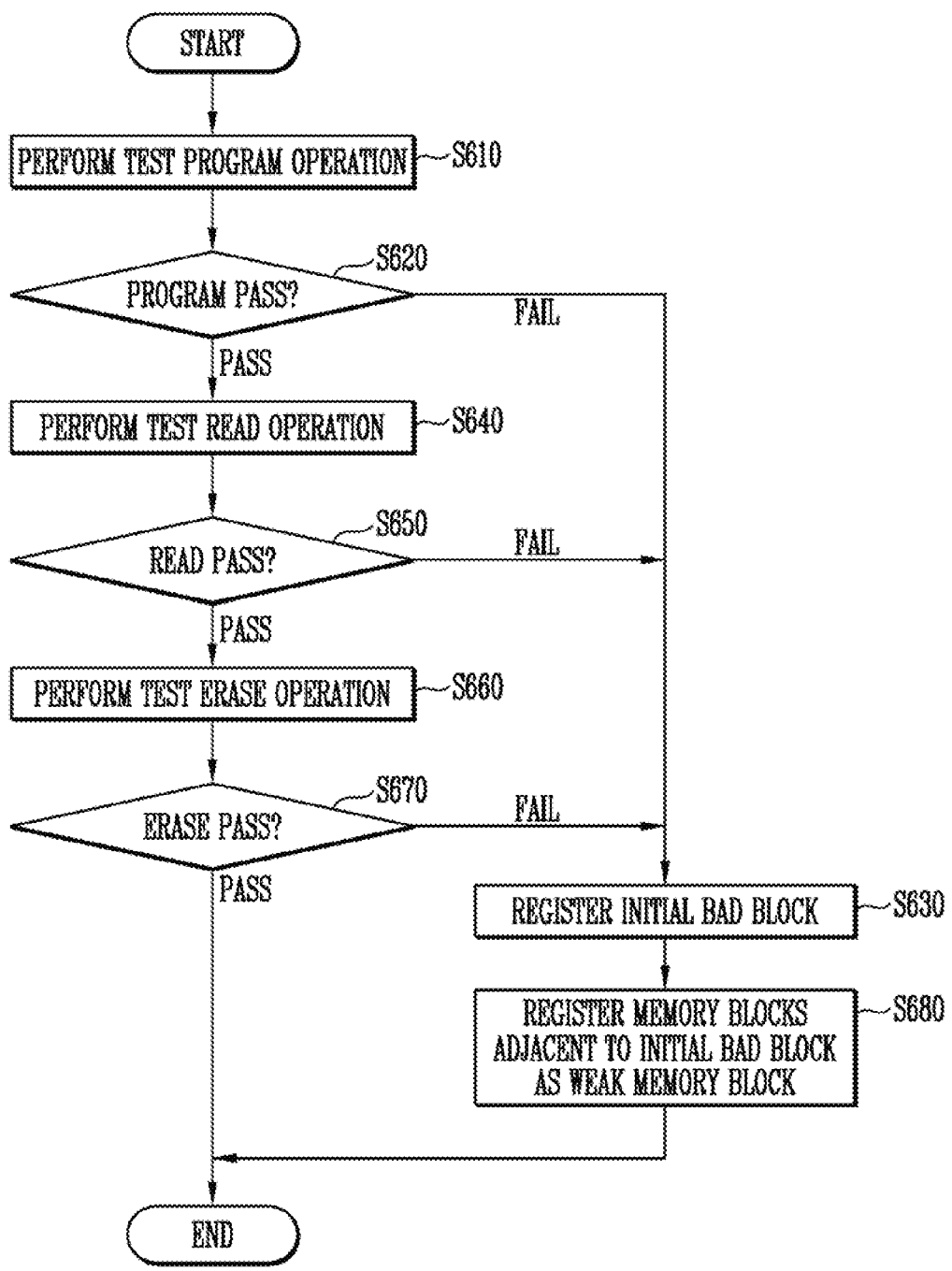
FIG. 6 is a flowchart illustrating an initial test operation of the memory system in accordance with an embodiment of the present disclosure.

FIG. 6 is a flowchart illustrating an initial test operation of the memory system in accordance with an embodiment of the present disclosure.

The initial test operation of the memory system in accordance with the embodiment of the present disclosure will be described as follows with reference to FIGS. 1 to 6.

The initial test operation performs on the plurality of semiconductor memories 1110 included in the memory device 1100. In an embodiment of the present disclosure, for convenience of description, the initial test operation on one semiconductor memory will be described.

The memory controller 1200 controls the memory device 1100 to perform the test program operation, and the semiconductor memory 1110 included in the memory device 1100 performs the test program operation under the control of the memory controller 1200 (S610). The test program operation may be performed on the plurality of memory blocks MB1 to MBk 110 included in the semiconductor memory 1110.

The semiconductor memory 1110 determines whether a test program operation of the memory blocks MB1 to MBk 110 has been normally performed, i.e., whether the test program operation of the memory blocks MB1 to MBk 110 has passed, by performing a program verify operation after the test program operation on the memory blocks MB1 to MBk 110 (S620).

When a memory block determined as fail is detected in the above-described step S620 (Fail), the semiconductor memory 1110 transmits information on the detected memory block to the bad block manager 1211 of the memory controller 1200. The bad block manager 1211 registers, as an initial bad block, the memory block determined as fail, based on a result obtained by performing the test program operation.

The memory controller 1200 controls the memory device 1100 to perform a test read operation, and the semiconductor memory 1110 performs the test read operation on memory blocks determined as pass in the above-described step S620 (S640).

The semiconductor memory 1110 determines whether the test read operation of the memory blocks has passed, by performing a read verify operation after the test read operation (S650).

When a memory block determined as fail is detected in the above-described step S650 (Fail), the semiconductor memory 1110 transmits information on the detected memory block to the bad block manager 1211 of the memory controller 1200. The bad block manager 1211 registers, as an initial bad block, the memory block determined as fail, based on a result obtained by performing the test read operation.

The memory controller 1200 controls the memory device 1100 to perform a test erase operation, and the semiconductor memory 1110 performs the test erase operation on memory blocks determined as pass in the above-described step S650 (S660).

The semiconductor memory 1110 determines whether the test erase operation of the memory blocks has passed, by performing an erase verify operation after the test erase operation (S670).

When a memory block determined as fail is detected in the above-described step S670 (Fail), the semiconductor memory 1110 transmits information on the detected memory block to the bad block manager 1211 of the memory controller 1200. The bad block manager 1211 registers, as an initial bad block, the memory block determined as fail, based on a result obtained by performing a test erase operation.

The weak memory block manager 1212 of the memory controller 1200 receives information Bad_Add on an initial bad block from the bad block manager 1211, and registers, as a weak memory block, memory blocks physically adjacent to the initial bad block, based on the information on the initial bad block (S680). For example, the information on the initial bad block may include addresses of memory blocks registers as initial bad blocks. For example, when a memory block MB2 is an initial bad block, memory blocks MB1 and MB3 physically adjacent to the memory block MB2 are registered as a weak memory block.

Figure 7:
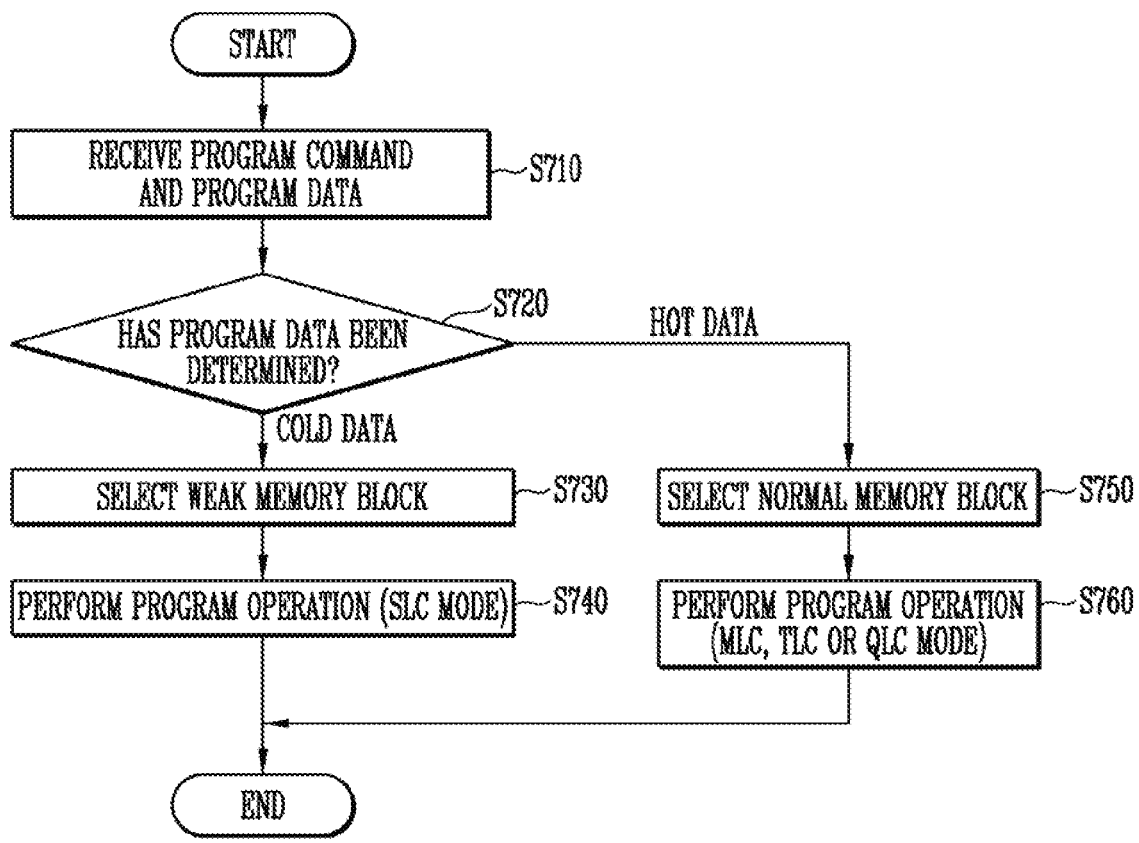
FIG. 7 is a flowchart illustrating a program operation of the memory system in accordance with an embodiment of the present disclosure.

FIG. 7 is a flowchart illustrating a program operation of the memory system in accordance with an embodiment of the present disclosure.

The program operation of the memory system in accordance with an embodiment of the present disclosure will be described as follows with reference to FIGS. 1 to 5 and 7.

When a program command and program data are received from the host 2000 (S710), the memory controller 1200 determines whether the program data is cold data or hot data, by analyzing the received program command and the received program data (S720). For example, when the received program data has a read and write frequency of a set value or more, the memory controller 1200 determines the program data as hot data. When the received program data has a read and write frequency of less than the set value, the memory controller 1200 determines the program data as cold data.

When the received program data is determined as the cold data in the above-described step S720, the memory controller 1200 selects, as a memory block to be programmed, at least one weak memory block among weak memory blocks registered in the weak memory block manager 1212 (S730).

The memory controller 1200 controls the memory device 1100 to program the program data to the selected weak memory block in response to the program command. The memory controller 1200 controls the memory device 1100 to perform a program operation by using a Single Level Cell (SLC) program scheme having high reliability. The memory device 1100 programs the program data to the selected weak memory block by using the SLC program scheme (S740).

When the received program data is determined as the hot data in the above-described step S720, the memory controller 1200 selects, as a memory block to be programmed, at least one memory block among the other normal memory blocks except the bad block and the weak memory block (S750).

The memory controller 1200 controls the memory device 1100 to program the program data to the selected normal memory block in response to the program command. The memory controller 1200 controls the memory device 1100 to perform a program operation by using a Multi-Level Cell (MLC) program scheme, a Triple Level Cell (TLC) program scheme, or a Quadruple Level Cell (QLC) program scheme, which has high data storage capacity. The memory device 1100 programs the program data to the selected normal memory block by using the MLC program scheme, the TLC program scheme TLC, or the QLC program scheme (S760).

Also, the memory controller 1200 may set and manage a refresh period of the weak memory blocks of which program operation has been completed to be shorter than that of the normal memory block.

As described above, in accordance with an embodiment of the present disclosure, the memory system determines, as a weak memory block, memory blocks physically adjacent to an initial bad block, uses the weak memory block in a cold data program operation, performs a program operation by using the SLC program scheme, and controls a refresh period of the weak memory block to be shorter than that of a normal memory block, so that the reliability of data stored in the weak memory block can be improved.

Figure 8:
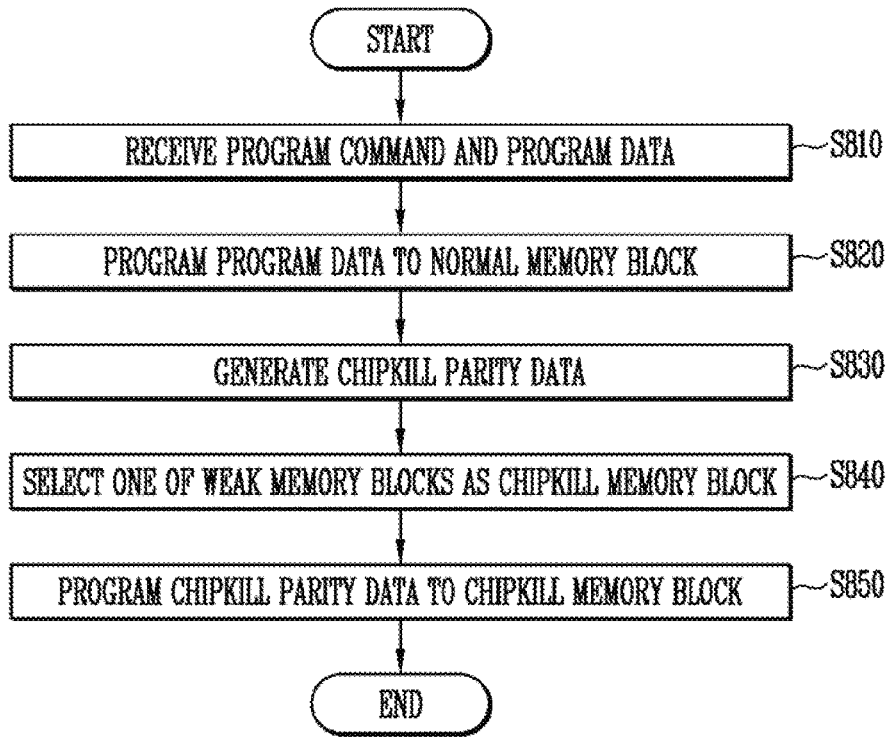
FIG. 8 is a flowchart illustrating a program operation of the memory system in accordance with another embodiment of the present disclosure.

FIG. 8 is a flowchart illustrating a program operation of the memory system in accordance with an embodiment of the present disclosure.

The program operation of the memory system in accordance with the an embodiment of the present disclosure will be described as follows with reference to FIGS. 1 to 5 and 8.

When a program command and program data are received from the host 2000 (S810), the memory controller 1200 selects a normal memory block on which a program operation is to be performed among a plurality of memory blocks included in the memory device 1100, and transmits, to the memory device 1100, the program data and an internal command CMD for controlling the program operation.

A selected semiconductor memory among the plurality of semiconductor memories 1110 included in the memory device 1100 programs the program data to the selected normal memory block by receiving the internal command CMD and the program data (S820).

The memory controller 1200 generates chipkill parity data by calculating data stored in memory blocks of each of different semiconductor memories (S830). The method for generating the chipkill parity data will be described in the following description related to FIG. 9.

The chipkill management block of the memory controller 1200 selects, as a chipkill memory block, any one of weak memory blocks registered in the weak memory block manager 1212 (S840).

Subsequently, the memory controller 1200 transmits the chipkill parity data to a semiconductor memory 1110 including the memory block selected as the chipkill memory block, and the semiconductor memory 1110 programs the chipkill parity data received from the memory controller 1200 to the memory block selected as the chipkill memory block (S850).

As described above, in accordance with the another embodiment of the present disclosure, the memory system determines, as a weak memory block, memory blocks physically adjacent to an initial bad block, and uses the weak memory block as a chipkill memory block which stores chipkill parity data.

Figure 9:
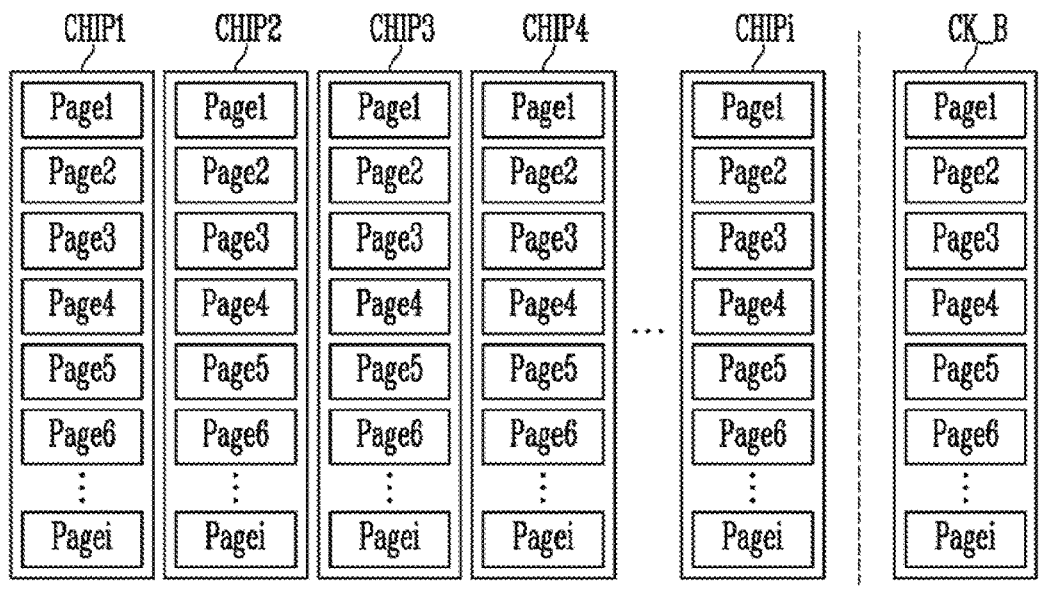
FIGS. 9 and 10 are diagrams illustrating chipkill of the memory system.
Figure 10:
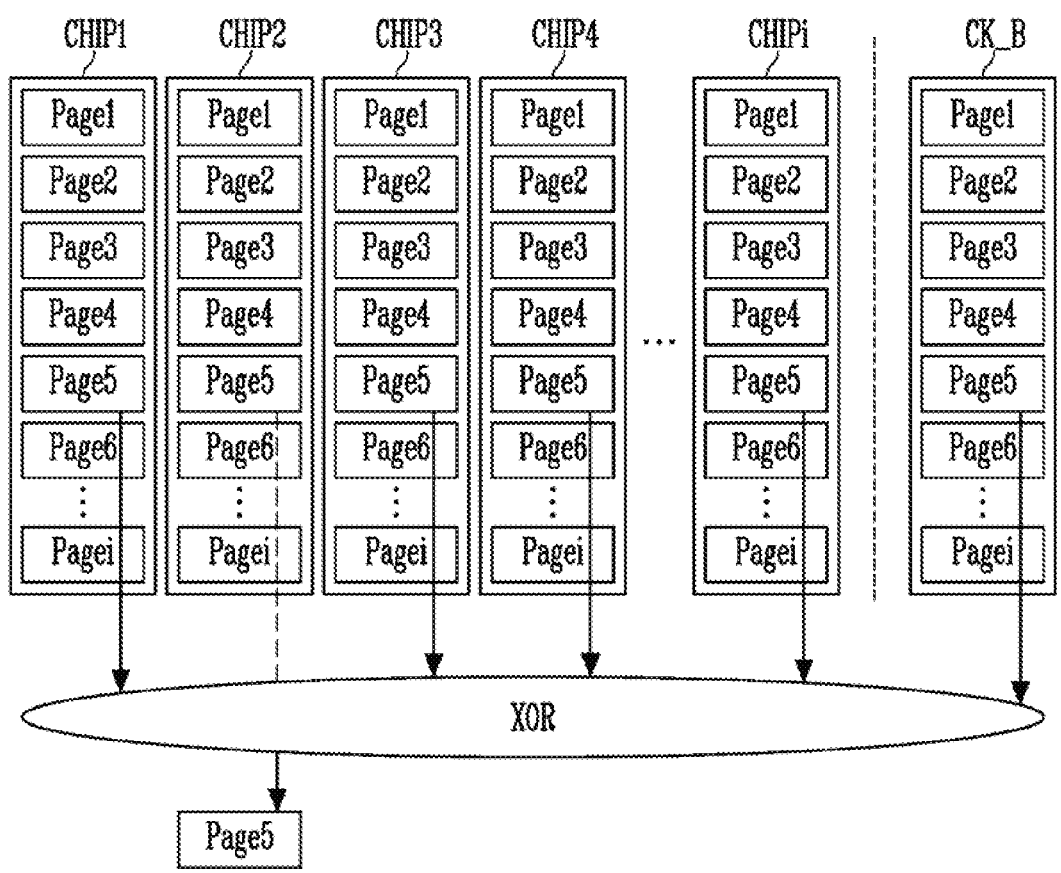

FIGS. 9 and 10 are diagrams illustrating chipkill of the memory system.

The chipkill is a technique used to recover an error when the error occurs in a specific semiconductor memory. The chipkill is a technique in which a chipkill parity is generated by calculating data stored in different semiconductor memories, and data of the other semiconductor memories except a selected semiconductor memory and the chipkill parity are calculated when an error occurs in the selected semiconductor memory, thereby recovering data of the selected semiconductor memory.

When an error occurs during a read operation of a selected semiconductor memory, data of the selected semiconductor memory may be recovered by performing an error recovery operation. However, in order to prepare for a case where the data cannot be recovered by performing the error recovery operation, a chipkill parity of a plurality of semiconductor memories may be generated, and be stored in a chipkill memory block. In an embodiment of the present disclosure, memory blocks physically adjacent to an initial bad block may be registered as weak memory blocks, and one of the registered weak memory blocks may be used as a chipkill memory block.

First to ith semiconductor memories CHIP1 to CHIPi shown in FIG. 9 are semiconductor memories coupled to different channels. For example, the first semiconductor memory CHIP1 shown in FIG. 9 may be a semiconductor memory coupled to the first channel CH1 shown in FIG. 1, the second semiconductor memory CHIP2 may be a semiconductor memory coupled to the second channel CH2 shown in FIG. 1, and the ith semiconductor memory CHIPi may be a semiconductor memory coupled to the ith channel CHi shown in FIG. 1. Each of the semiconductor memories may be a memory chip.

A chipkill memory block CK_B may be selected from weak memory blocks among the plurality of memory blocks included in the memory device 1100.

The first to ith semiconductor memories CHIP1 to CHIPi may include a plurality of normal memory blocks, and each of the normal memory blocks may include a plurality of pages Page1 to Pagei. The pages Page1 to Pagei shown in the drawing may be pages included in any one memory block among memory blocks included in each semiconductor memory.

A chipkill parity of the first pages Page1 of the first to ith semiconductor memories CHIP1 to CHIPi may be stored in a first page Page1 of the chipkill memory block CK_B, and a chipkill parity of the second pages Page2 of the first to ith semiconductor memories CHIP1 to CHIPi may be stored in a second page Page2 of the chipkill memory block CK_B. In this manner, a chipkill parity of the ith pages Pagei of the first to ith semiconductor memories CHIP1 to CHIPi may be stored in an ith page Pagei of the chipkill memory block CK_B.

The chipkill parity may be performed by performing an XOR calculation on data of the same pages of the semiconductor memories CHIP1 to CHIPi. For example, when data is programmed to the first pages Page1 of the first to ith semiconductor memories CHIP1 to CHIPi, a result value obtained by performing the XOR calculation on the data of the first pages Page1 of the first to ith semiconductor memories CHIP1 to CHIPi may be stored as a chipkill parity in the chipkill memory block CK_B. Therefore, in order to read data stored in a selected page of a selected semiconductor memory among the first to ith semiconductor memories CHIP1 to CHIPi, an XOR calculation may be performed on a chipkill parity of a page corresponding to the selected page among the first to ith pages Page1 to Pagei of the chipkill memory block CK_B and data stored in pages of unselected semiconductor memories may be XOR-calculated. The XOR calculation may be performed in the memory controller (1200 shown in FIG. 1).

Referring to FIG. 10, when an error occurs during a read operation of the fifth page Page5 of the second semiconductor memory CHIP2, the memory controller (1200 shown in FIG. 1) does not access the second semiconductor memory CHIP2, but may read a chipkill parity of a corresponding page, stored in the fifth page Page5, and data of the fifth pages Page5 of the other unselected semiconductor memories CHIP1 and CHIP3 to CHIPi and perform an XOR calculation on the read data and the chipkill parity of the corresponding page, thereby obtaining data of the fifth page Page5 of the second semiconductor memory CHIP2.

Figure 11:
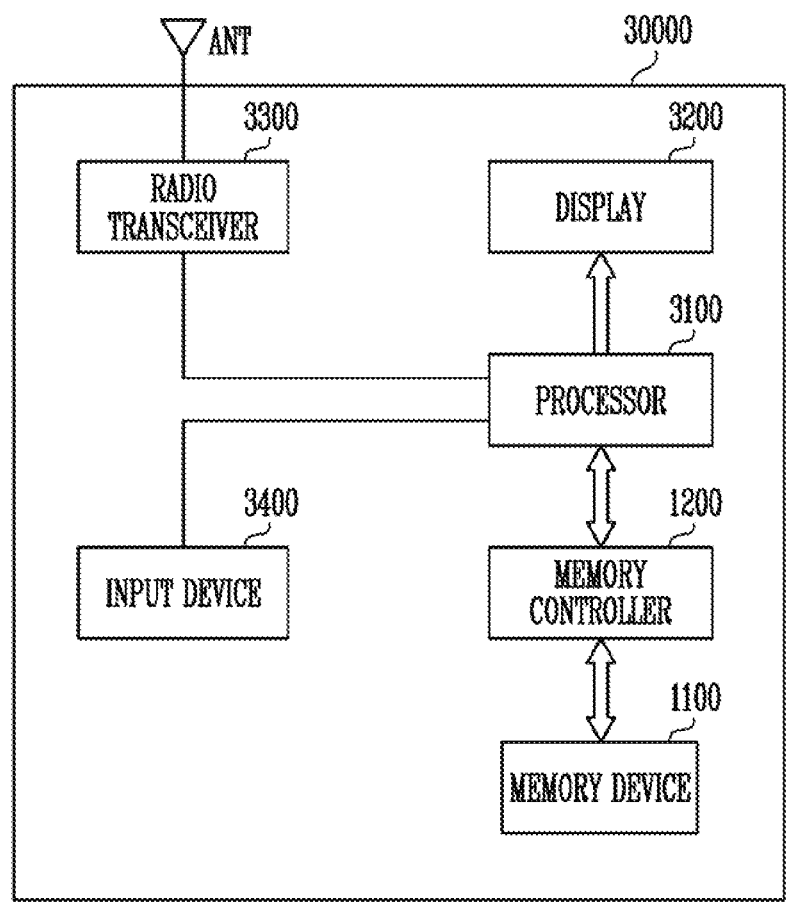
FIG. 11 is a diagram illustrating another embodiment of the memory system.

FIG. 11 is a diagram illustrating an embodiment of the memory system.

Referring to FIG. 11, the memory system 30000 may be implemented as a cellular phone, a smart phone, a tablet PC, a personal digital assistant (PDA), or a wireless communication device. The memory system 30000 may include a memory device 1100 and a memory controller 1200 capable of controlling an operation of the memory device 1100. The memory controller 1200 may control a data access operation of the memory device 1100, e.g., a program operation, an erase operation, a read operation, or the like under the control of a processor 3100.

Data programmed in the memory device 1100 may be output through a display 3200 under the control of the memory controller 1200. The memory device 1100 may be configured and operated identically to the memory device 1100 shown in FIG. 1, and the memory controller 1200 may be configured and operated identically to the memory controller 1200 shown in FIG. 1.

A radio transceiver 3300 may transmit/receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may transmit the signal processed by the processor 3100 to the memory device 1100. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the memory device 1100 may be implemented as a part of the processor 3100, or be implemented as a chip separate from the processor 3100.

Figure 12:
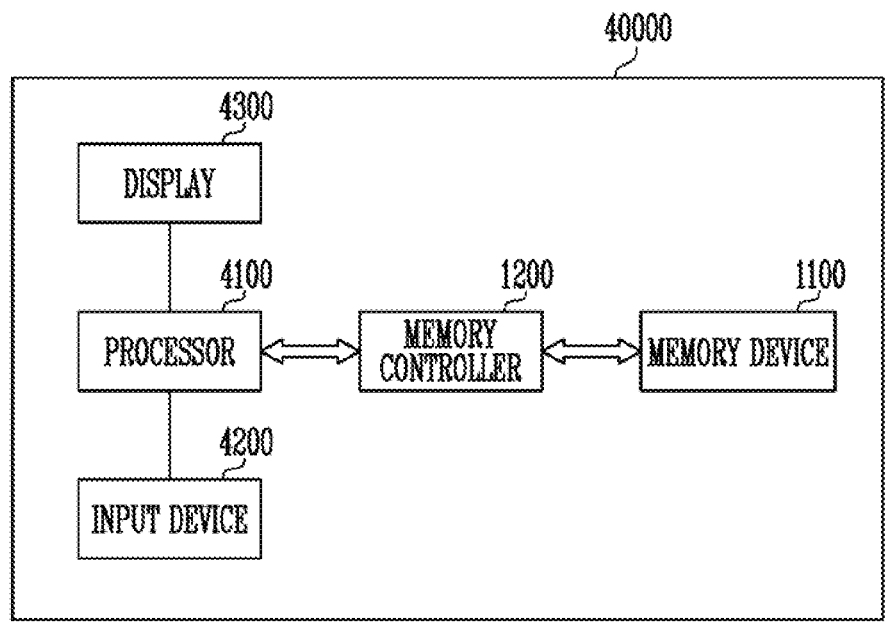
FIG. 12 is a diagram illustrating another embodiment of the memory system.

FIG. 12 is a diagram illustrating an embodiment of the memory system.

Referring to FIG. 12, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 1100 and a memory controller 1200 capable of controlling a data processing operation of the memory device 1100. The memory device 1100 may be configured and operated identically to the memory device 1100 shown in FIG. 1, and the memory controller 1200 may be configured and operated identically to the memory controller 1200 shown in FIG. 1.

A processor 4100 may output data stored in the memory device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the memory device 1100 may be implemented as a part of the processor 4100, or be implemented as a chip separate from the processor 4100.

Figure 13:
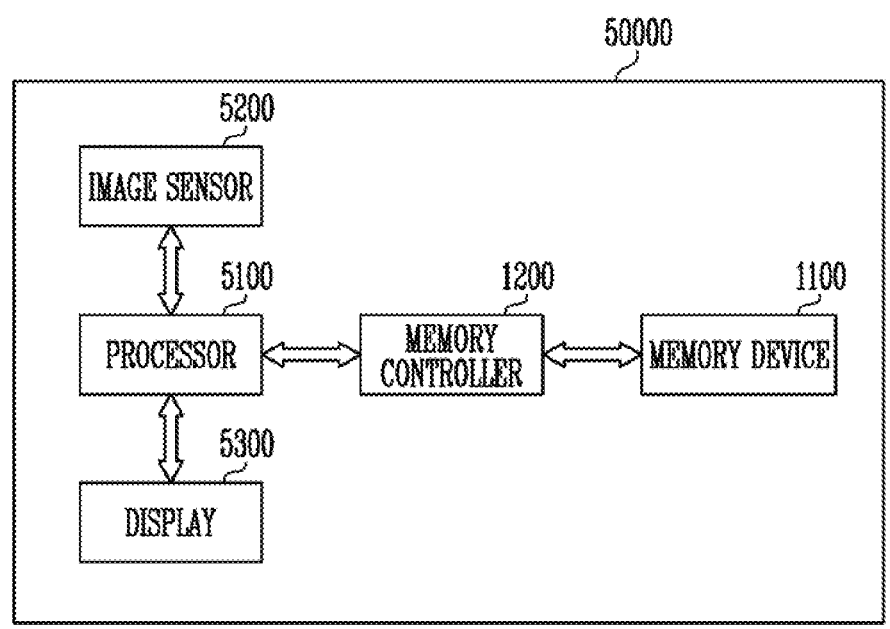
FIG. 13 is a diagram illustrating another embodiment of the memory system.

FIG. 13 is a diagram illustrating an embodiment of the memory system.

Referring to FIG. 13, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 1100 and a memory controller 1200 capable of controlling a data processing operation of the memory device 1100, e.g., a program operation, an erase operation, or a read operation. The memory device 1100 may be configured and operated identically to the memory device 1100 shown in FIG. 1, and the memory controller 1200 may be configured and operated identically to the memory controller 1200 shown in FIG. 1.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the memory device 1100 through the memory controller 1200. In addition, data stored in the memory device 1100 may be output through the display 5300 under the control of the processor 5100 or the memory controller 1200.

In some embodiments, the memory controller 1200 capable of controlling an operation of the memory device 1100 may be implemented as a part of the processor 5100, or be implemented as a chip separate from the processor 5100.

Figure 14:
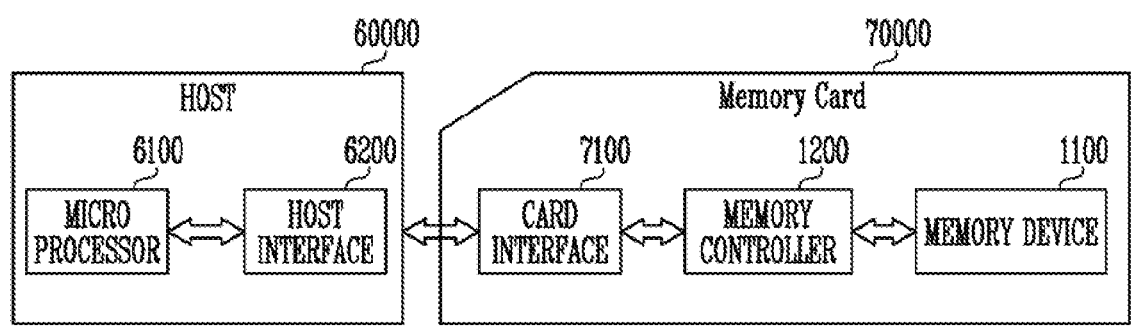
FIG. 14 is a diagram illustrating another embodiment of the memory system.

FIG. 14 is a diagram illustrating an embodiment of the memory system.

Referring to FIG. 14, the memory system 70000 may be implemented as a memory card or a smart card. The memory system 70000 may include a memory device 1100, a memory controller 1200, and a card interface 7100. The memory device 1100 may be configured and operated identically to the memory device 1100 shown in FIG. 1, and the memory controller 1200 may be configured and operated identically to the memory controller 1200 shown in FIG. 1.

The memory controller 1200 may control data exchange between the memory device 1100 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the memory controller 1200 under the control of a microprocessor 6100.

In accordance with the present disclosure, a weak memory block is efficiently managed, so that stability and reliability can be improved.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory system comprising:
   a memory device including a plurality of memory blocks; and
   a memory controller configured to control the memory device to detect an initial bad block by performing an initial test operation on the plurality of memory blocks,
   wherein the memory controller registers and manages, as a weak memory block, memory blocks physically adjacent to the detected initial bad block, and
   wherein the memory controller controls the memory device to program the memory blocks registered as the weak memory block by using a single level cell program scheme in a program operation.

2. The memory system of claim 1, wherein the memory controller includes a memory block management block configured to receive information on the detected initial bad block in the initial test operation, and registers and manage, as the weak memory block, the memory blocks physically adjacent to the initial bad block, based on the information on the initial bad block.

3. The memory system of claim 1, wherein the memory controller classifies program data received from a host outside of the memory controller in a program operation into cold data and hot data, based on a read and write frequency of the program data.

4. The memory system of claim 3, wherein the memory controller controls the memory device to select and program at least one of the memory blocks registered as the weak memory block in a program operation using the cold data.

5. The memory system of claim 3, wherein the memory controller controls the memory device to select and program at least one of normal memory blocks except the memory blocks registered as the weak memory block in a program operation using the hot data.

6. The memory system of claim 5, wherein the memory controller sets and manages a refresh period of the memory blocks registered as the weak memory block to be shorter than that of the normal memory blocks.

7. The memory system of claim 2, wherein the memory controller further includes a chipkill management block configured to select, as a chipkill memory block, the weak memory block registered in the memory block management block, and control chipkill parity data generated using data stored in each of the plurality of memory blocks to be stored in the chipkill memory block.

8. A memory system comprising:
   a memory device including a plurality of semiconductor memories; and
   a memory controller configured to control the memory device to detect an initial bad block among a plurality of memory blocks included in each of the plurality of semiconductor memories by performing an initial test operation on the plurality of semiconductor memories,
   wherein the memory controller registers, as a weak memory block, memory blocks adjacent to the detected initial bad block, and selects the weak memory block as a chipkill memory block which stores a chipkill parity of the plurality of semiconductor memories.

9. The memory system of claim 8, wherein the memory controller includes a memory block management block configured to receive information on the detected initial bad block in the initial test operation, and registers and manages, as the weak memory block, memory blocks physically adjacent to the initial bad block, based on the information on the initial bad block.

10. The memory system of claim 9, wherein the memory controller further includes a chipkill management block configured to select, as a chipkill memory block, the weak memory block registered in the memory block management block, and control chipkill parity data generated using data stored in each of the plurality of semiconductor memories to be stored in the chipkill memory block.

11. A method for operating a memory system, the method comprising:
    detecting an initial bad block among a plurality of memory blocks included in a memory device by performing an initial test operation;
    registering, as a weak memory block, memory blocks physically adjacent to the detected initial bad block among the plurality of memory blocks;
    receiving a program request for cold data from a host outside of the memory system; and
    programming the cold data by selecting at least one of the memory blocks registered as the weak memory block.

12. The method of claim 11, wherein the memory blocks registered as the weak memory block are programmed using a single level cell program scheme.

13. The method of claim 12, comprising:
    receiving a program request for hot data from the host; and programming the hot data by selecting at least one of the other normal memory blocks except the memory blocks registered as the weak memory block among the plurality of memory blocks.

14. The method of claim 13, wherein the normal memory blocks are programmed using at least one of a multi-level cell program scheme, a triple level cell program scheme, and a quadruple level cell program scheme.

15. The method of claim 13, wherein a refresh period of the memory blocks registered as the weak memory block is shorter than that of the normal memory blocks.

16. A method for operating a memory system, the method comprising:
- detecting an initial bad block among a plurality of memory blocks included in a memory device by performing an initial test operation;
- registering, as a weak memory block, memory blocks physically adjacent to the detected initial bad block among the plurality of memory blocks;
- storing program data in a selected memory block among the plurality of memory blocks in a program operation;
- storing chipkill parity data by using data stored in the selected memory block and data stored in some memory blocks of which program operation has been completed among the plurality of memory blocks; and
- selecting, as a chipkill memory block, any one of the memory blocks registered as the weak memory block, and storing the chipkill parity data in the chipkill memory block.

17. The method of claim 16, wherein the chipkill parity data is generated by performing an exclusive or (XOR) calculation on the data stored in the selected memory block and the data stored in the some memory blocks.

18. The method of claim 16, wherein, when an error occurs in a read operation of the data stored in the selected memory block, the data stored in the selected memory block is recovered using the data stored in the some memory blocks and the chipkill parity data.

* * * * *